(12) United States Patent
Naoi

(10) Patent No.: US 6,168,442 B1
(45) Date of Patent: Jan. 2, 2001

(54) ANISOTROPIC CONDUCTIVITY SHEET WITH POSITIONING PORTION

(75) Inventor: Masaya Naoi, Tokyo (JP)

(73) Assignee: JSR Corporation, Tokyo (JP)

(*) Notice: Under 35 U.S.C. 154(b), the term of this patent shall be extended for 0 days.

(21) Appl. No.: 09/218,159

(22) Filed: Dec. 22, 1998

(51) Int. Cl.[7] ........................................ H01R 4/58
(52) U.S. Cl. ............................ 439/91; 439/66
(58) Field of Search ........................ 439/66, 55, 86, 439/91, 586, 591; 361/785, 705, 764

(56) References Cited

U.S. PATENT DOCUMENTS

| | | | |
|---|---|---|---|
| 5,010,038 | * 4/1991 | Fox et al. | 438/106 |
| 5,049,085 | * 9/1991 | Reylek et al. | 439/91 |
| 5,109,320 | * 4/1992 | Bourdelaise et al. | 361/413 |
| 5,207,585 | * 5/1993 | Byrnes et al. | 439/66 |
| 5,298,686 | * 3/1994 | Bourdelaise et al. | 174/254 |

\* cited by examiner

*Primary Examiner*—Neil Abrams
*Assistant Examiner*—Michael C. Zarroli
(74) *Attorney, Agent, or Firm*—Oblon, Spivak, McClelland, Maier & Neustadt, P.C.

(57) ABSTRACT

An anisotropic conductivity sheet is formed with a conductive portion, in which conductive material is linked in a thickness direction within an insulator, and a positioning portion, which is formed of an insulator having elasticity at a portion other than the conductive portion. A metal plate for positioning is provided in a peripheral portion of the anisotropic conductivity sheet.

11 Claims, 8 Drawing Sheets

ANISOTROPIC CONDUCTIVITY SHEET WITH POSITIONING PORTION

CROSS REFERENCE TO RELATED CASES

This application is based on patent application Ser. No. 9-202165 (1997) filed Jul. 11, 1997 in Japan, the content of which is incorporated hereinto by reference.

BACKGROUND OF THE INVENTION

FIELD OF THE INVENTION

The present invention relates to an anisotropic conductivity sheet having a positioning portion employed for establishing electrical connection between electrical circuit components, electrical circuit boards or the like. The present invention may be used in inspection and measurement of electrical characteristics of electric circuit components, electrical circuit boards and so on.

DESCRIPTION OF THE RELATED ART

In the recent years, due to down-sizing of electrical products or increasing of density of wiring, pitches between electrodes to be inspected or measured in inspection and measurement of electrical circuit components, electrical circuit boards and the like, have been becoming relatively fine. Accordingly, for example, electrical mutual connection between the electrical circuit components is established through inspection electrodes having fine inter-electrode pitch. At this time, it has become difficult to position the electrode of the electrical circuit component with the inspection electrode. In such circumstance, it is not easy to accurately contact the electrode of a conductive sheet with the inspection electrode of the electrical circuit component, electrical circuit board or the like, thereby creating difficulty in stably obtaining good electrical contact. In the foregoing background, devices a conductive sheet functioning as an electrical connecting member, which can accurately contact the electrode of the conductive sheet with the inspection electrode of the electrical circuit component, the electrical circuit board or the like with each other, and has superior electrical conduction performance in fine wiring pitch, becomes necessary.

Conventionally, in inspection and measurement of the electrical circuit component, the electrical circuit board or the like, the inspection electrode of the electrical circuit component, the electrical circuit board or the like and the electrode of the conductive sheet has to accurately contact each other. Furthermore, in fabrication of the conductive sheet having superior conduction performance in fine wiring pitch, the conductive sheet is sandwiched between resin films. On the other hand, for positioning of electrodes of an article to be measured and an inspection electrode, positioning holes on the film are used.

However, in the conductive sheet employing the resin film, since formation of the positioning hole of the film is performed by means of a punching die, when formed products of a plurality of the conductive sheets are to be obtained from a pair of dies, a plurality of holes have to be punched on the film simultaneously. At this time, due to deformation of the film, it is difficult to obtain position accuracy with respect to the predetermined position of the positioning hole. On the other hand, upon fabrication of an anisotropic conductivity sheet, the film is heated and cured under a magnetic field to form the anisotropic conductivity sheet. In this case, when a plurality of anisotropic conductivity films are formed simultaneously for mass-production, offset relative to the predetermined position can result due to various factors, such as deflection of the resin film, dimensional variation of the film and so on, in positioning relative to the predetermined position of the obtained formed product, resulting in difficulty in practical use.

On the other hand, it is possible to make it difficult to cause offset of electrode formed in each film on the die, by dividing the resin film into the individual pieces and setting the divided individual piece within the die. In this case, since positioning pins have to be set at positions corresponding to the positioning holes per the individual pieces on the die, cost for the die becomes high. Furthermore, since each film has to be set in the die in one-by-one, number of process steps is also increased.

Furthermore, when the anisotropic conductivity sheet is used as electrical connection member in a test socket for a burn-in test, a heat-cycle test and so on for finding initial failure of semiconductor element or the like, if the anisotropic conductivity sheet provided with the positioning holes in the resin film is used, position offset of the electrodes between the electrode of the anisotropic conductivity sheet and the electrode of the measurement object can be caused due to thermal expansion of the resin film causing difficulty in obtaining stable and good electrical contact. Thus, as a result, accurate measurement becomes difficult.

SUMMARY OF THE INVENTION

It is therefore an object of the present invention to provide an anisotropic conductivity sheet having a positioning portion which can (i) accurately position an electrode of an anisotropic conductivity sheet relative to an electrical circuit component having relatively fine inter-electrode pitch, (ii) can establish stable contact to obtain stable electrical conduction when the anisotropic conductivity sheet is employed as an electrical connection member between electrical circuit components or electrical circuit boards with each other, during inspection and measurement of the electrical circuit components or the electrical circuit board.

Another object of the present invention is to provide an isotropic conductivity sheet having the positioning portion which can accurately position an electrode of the anisotropic conductivity sheet relative to the electrode of a semiconductor element as an inspection object even in a semiconductor test over a wide use temperature range in the anisotropic conductivity sheet.

A further object of the present invention is to provide an anisotropic conductivity sheet having a positioning portion which is constructed by forming a conductive portion where conductive materials are linked in a thickness direction in an insulator, and a portion other than conductive portion is formed of elastic insulator, and has a positioning metal plate in the peripheral portion of the anisotropic conductivity sheet.

The present invention provides an anisotropic conductivity sheet with a positioning portion, the sheet comprising a conductive portion, in which conductive material is linked in a thickness direction in an insulator, and a part other than the conductive portion, the part being formed of the insulator having an elasticity, wherein a metal plate for positioning is arranged on a peripheral portion of the anisotropic conductivity sheet.

One embodiment of the anisotropic conductivity sheet with the positioning metal plate according to the present invention can attain stable electrical contact by absorbing a step difference in the thickness direction of wiring of an electric circuit board and step difference in a thickness direction due to fluctuation of accuracy and so on in the thickness direction of an electrode portion of an elastic material, to eliminate offset in a plane direction. On the other hand, due to mass production of the anisotropic conductivity sheets, it becomes possible to produce a plurality of anisotropic conductivity sheet within a pair of die to increase production.

On the other hand, by establishing electrical connection of the positioning metal plate with the ground of a measuring system, elimination of static charge in the anisotropic conductivity sheet is facilitated to achieve shielding effect of a high frequency noise.

Furthermore, in a test over a wide temperature range, by using a metal having a linear expansion coefficient less than or equal to $1\times10^{-5}$/K, such as invar (anvar), super invar, kovar and the like, the electrode portion of the anisotropic conductivity sheet positioned under normal temperature will not be subject to the influence of position offset due to temperature difference thereby obtaining stable electrical contact.

The above and other objects, effects, features and advantages of the present invention will become more apparent from the following description of the embodiments thereof taken in conjunction with the accompanying drawings.

BRIEF DESCRIPTION OF THE DRAWINGS

A more complete appreciation of the invention and many of the attendant advantages thereof will be readily obtained as the same becomes better understood by reference to the following detailed descriptions when considered in connection with the accompanying drawings, wherein.

DESCRIPTION OF THE PREFERRED EMBODIMENT

Figure 1:
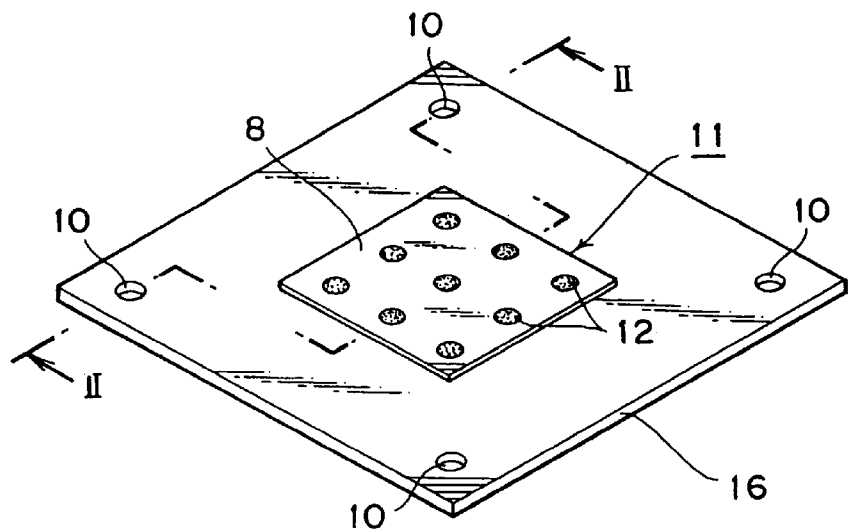
FIG. 1 is a perspective view diagrammatically showing one embodiment of an anisotropic conductivity sheet with a positioning portion according to the present invention.

Referring now to the drawings, wherein like reference numerals designate identical or corresponding parts throughout the several views, and more particularly to FIGS. 1–11 thereof, there are illustrated exemplary embodiments of the present invention.

Figure 2:
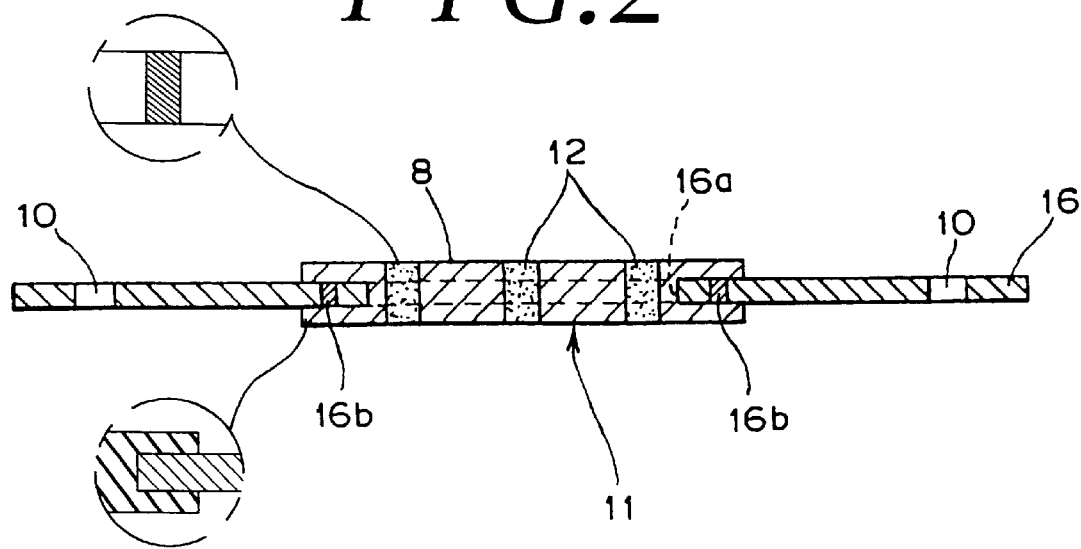
FIG. 2 is a section taken along line II—II in example of FIG. 1.

FIGS. 1 and 2 diagrammatically show an anisotropic conductivity sheet with the positioning portion according to the present invention.

In FIGS. 1 and 2, an anisotropic conductivity sheet 11 includes a plurality of conductive portions 12 forming an electrical connecting portion. The sheet 11 also includes an insulating portion 8. Around the insulating portion 8 and the conductive portions 12, a positioning metal plate 16 which will be explained later, is provided.

The insulating portion 8 formed surrounding the conductive portions 12 is formed into a substantially square shape with a predetermined thickness. The insulating portion 8 is provided substantially at a center portion of the positioning metal plate 16, for example.

The insulator to be used as a material of the insulating portion 8 is preferably an elastic insulator. As the elastic insulator, a rubber-like polymer may be used.

Here, further detailed description will be given for the use of silicone rubber.

As the rubber-like polymer, a diene type rubber, such as polybutadiene, natural rubber, polyisoprene, SBR, NBR and the like and their hydrogenate, a block copolymer, such as styrene butadiene block copolymer, styrene isoprene block copolymer and the like, and their hydrogenate, chloroprene, urethane rubber, polyethylene type rubber, epichlorohydrin rubber, silicone rubber, ethylene-propylene copolymer, ethylene propylene diene copolymer and the like can be used.

When weathering resistance is required, rubber-like copolymer other than diene type rubber is preferred. Particularly, in viewpoint of molding ability and electrical characteristics, silicone rubber is preferred.

A silicone rubber formed by crosslinking or condensation of a liquid silicone rubber is preferred. It is preferred that the liquid silicone rubber has viscosity of strain ratio of $10^{-1}$ sec and less than or equal to $10^5$ g/cm.s, and can be any of condensed type, additive type, vinyl group or hydroxy group containing type and so on. More particularly, the liquid silicone rubber can be dimethyl silicone crude rubber, methyl vinyl silicone crude rubber, methyl phenyl vinyl silicone crude rubber and the like.

The vinyl group containing silicone rubber normally can be obtained through hydrolysis and condensation reaction under presence of dimethyl vinyl chlorosilane, dimethyl vinyl alcoxy silane, and by subsequent fractionation by repeating melting and precipitation.

On the other hand, silicone rubber containing vinyl group at both terminals can be obtained by (i) appropriately selecting a reaction condition (e.g. amount of cyclic siloxane and amount of end cap agent), upon obtaining copolymer by anionic polymerization of cyclic siloxane, such as octamethyl cyclotetra siloxane under presence of catalyst and (ii) by stopping polymerization by using the end cap agent, such as dimethyl divinyl siloxane. Here, as the catalyst, alkali, such as tetramethylammonium hydroxide and n-butylphosphonium hydroxide and the like and their silanolate solution and so on may be used. A reaction temperature may be within a range of 80 to 130° C., for example.

On the other hand, a hydroxyl group containing silicone rubber can be normally obtained through (i) hydrolysis and condensation reaction of dimethyl dialcoxy silane under presence of dimethyl hydrochlorosilane, methyl dihydro chlorosilane, dimethyl hydroalcoxy silane or the like and (ii) by subsequent fractionation by repeating melting and precipitation.

On the other hand, silicone rubber containing hydroxyl group at both terminals can be obtained by (i) appropriately selecting a reaction condition (e.g. an amount of cyclic siloxane and an amount of an end cap agent), upon obtaining copolymer by anionic polymerization of cyclic siloxane under presence of catalyst and by stopping polymerization by using the end cap agent, such as dimethyl hydrochloro silane, methyl dihydrochloro silane or dimethyl phosphonium. Here, as the catalyst, an alkali, such as tetramethyl ammonium hydroxide and n-butylphosphonium hydroxide and the like and their silanolate solution and so on may be used. A reaction temperature may be within a range of 80 to 130° C., for example.

Molecular weight (standard polystyrene equivalent weight average molecular weight) of the rubber-like polymer is preferably 10,000 to 40,000.

Molecular weight distribution index of rubberlike polymer component (a ratio of standard polystyrene equivalent weight average molecular weight and standard polystyrene equivalent number average molecular weight (hereinafter referred to as "Mw/Mn")) is preferably less than or equal to 2.0 in viewpoint of heat resistance of obtained conductive elastomer.

The number of conductive portions 12 in the anisotropic conductivity sheet 11 and a relative distance therebetween are set depending upon the number of electrodes of the inspection object and their relative distance, for example. The conductive material forming each conductive portion 12 in the anisotropic conductivity sheet 11 can be a conductive metal material, such as iron, copper, zinc, chrome, nickel, silver, cobalt, aluminum and the like, or a conductive metal material of an alloy consisting of two or more metals of the above metal elements.

Amongst the above-noted metal materials, nickel, iron, copper and the like is preferred in viewpoint of economy and conductive characteristics. More particularly, a nickel material coated with gold is preferred.

On the other hand, when silicone rubber is used as an insulator, it is preferred that a coating ratio of silane coupling agent of the conductive material surface is greater than or equal to 5%, more preferably in a range of 7 to 100%, a further preferably in a range of 10 to 100% and particularly preferably in a range of 20 to 100%.

Further, as to the shape of the conductive material, an aspect ratio (a ratio between short diameter and long diameter) is normally in a range of 1 to 1000, preferably in a range of 1 to 500, further preferably in a range of 1 to 100, yet further preferably in a range of 1 to 20, and more preferably in a range of 1 to 5, and most preferably in a range of 1 to 3.

The shape of the conductive material is not particularly limited. However, a spherical shape, a star shape, a particulate shape, a whisker shape, a rod-like shape, a fiber shape, and so on are preferred. Among them, the spherical shape, the star shape, the particulate shape, and the whisker shape are preferred. Particularly in viewpoint of easiness of dispersion of component or the mixture thereof, the spherical shape, the star shape, or the particulate shape, are preferred.

On the other hand, a short diameter of the conductive material is preferably in a range of 1 to 1000 $\mu$m, more preferably in a range of 2 to 500 $\mu$m, further preferably in a range of 5 to 300 $\mu$m, and particularly preferably in a range of 10 to 200 $\mu$m.

A long diameter distribution of the conductive material (the ratio Dw/Dn: weight-average diameter/long dimension-average diameter) is preferably in a range of 1 to 10, more preferably in a range of 1.01 to 7, further preferably in a range of 1.05 to 5, and particularly preferably in a range of 1.1 to 4.

A water content of the conductive material is preferably less than or equal to 5%, more preferably less than or equal to 3%, further preferably less than or equal to 2%, and particularly preferably less than or equal to 1%.

With the conductive material having particle diameter in a range set forth above, in the obtained conductive elastomer, upon use of anisotropic conductivity sheet 11, sufficient electrical contact can be obtained between conductive particles.

The shape of the conductive material is not particularly limited. However, a spherical shape, a star shape, a particulate shape, a whisker shape, a rod-like shape, a fiber shape, and so on are preferred. Among them, the spherical shape, the star shape, the particulate shape, and the whisker shape are preferred. Particularly in viewpoint of easiness of dispersion of component or the mixture thereof, the spherical shape, the star shape, or the particulate shape, are preferred.

In one embodiment of the present invention, nickel coated with gold is a particularly preferred conductive material. Such conductive material is provided by gold plating nickel by electroless plating and so on. The nickel with gold coating has a quite small contact resistance. When the gold coating is formed by plating, the average layer thickness is preferred to be greater than or equal to 1000 Å. On the other hand, as the plating amount, more than or equal to 1 Wt % of the conductive material is preferred. Further preferably, the plating amount is in a range of 2 to 10 Wt %, and more preferably in a range of 3 to 7 Wt %.

In one embodiment, the conductive material is contained in a ratio of 30 to 1000 Wt parts, more preferably 50 to 750 Wt parts with respect to 100 Wt parts of rubber-like polymer. When this ratio is less than 30 Wt parts, an electrical resistance value of the obtained conductive elastomer cannot be sufficiently low upon use of the anisotropic conductivity sheet 11 and thus cannot achieve satisfactory connecting function. On the other hand, when this ratio exceeds 1000 Wt parts, the elastomer is excessively hardened so as to be brittle and cause difficulty in use as the conductive elastomer.

In the conductive elastomer composition containing the rubber-like polymer and the conductive material as set forth above forming the electrical connecting portion, inorganic filler, such as normal silica powder, colloidal silica, aerogel silica, alumina and the like, may be contained as required. By providing such inorganic filler, improved thixotropic properties can be provided in a non-cured state, high viscosity can be achieved, the dispersion stability of the conductive material can be improved, and the strength of the elastomer after hardening can be improved.

While the amount of the inorganic filler used is not particularly limited, if it is used in excessively large amounts, orientation by magnetic field of the conductive metal material cannot be achieved sufficiently. It should be noted that the viscosity of the conductive elastomer composition of the present invention is preferred to be within a range of 100,000 to 1,000,000 cps at a temperature of 25° C.

The conductive elastomer composition is an elastomer provided with high elasticity through crosslinking or condensation reaction. Furthermore, since the elastomer contains a particular conductive material, a conductive elastomer can be provided.

The conductive elastomer composition can use a hardening catalyst for hardening. As such a hardening catalyst, organic peroxide, fatty azo compound, hydroxyl compound, nuclear radiation and the like can be used.

Organic peroxide may be selected among benzoyl peroxide, bis-dicyclobenzoyl peroxide, dicumyl peroxide, ditert-butylperoxide and the like. On the other hand, fatty azo compound can be azo bisisobutyro nitrite and the like.

A material to be used as the hydrosilylation catalyst may be a known material, more specifically, such as platinic chloride acid and salt thereof, platinum-unsaturated group containing siloxane complex, a complex of vinyl siloxane and platinum, a complex of triorganophosphine or phosphide and platinum, platinum diacetylacetonate, a complex of cyclic diene and platinum.

The amount of the hardening catalyst used is preferred to be a proper amount in consideration of balance between actual hardening speed, serviceable life and so on. On the other hand, in order to control the hardening speed and serviceable life, a hydrosililate reaction control agent, such as an amino group containing siloxane, hydroxy group containing siloxane and the like may be used.

The substantially square positioning metal plate 16 has a substantially square opening portion 16a where the conductive portions 12 and the insulating portion 8 are arranged at the center portions thereof.

On the entire peripheral portion of the opening portion 16a, a plurality of through holes 16b, in which parts of the insulating portion 8 are filled, respectively are formed with a predetermined interval. A diameter of the through hole 16b is selected to be smaller than a diameter of the positioning hole 10. Accordingly, the peripheral edge portion of the insulating portion 8 can be certainly fixed to the entire peripheral edge portion of the opening portion 16a of the positioning metal plate 16.

In the anisotropic conductivity sheet, to be employed for temperature test and so on of the electrical components and the like, as the material of the positioning metal plate 16, various material may be used. However, a material having a linear expansion coefficient (1/K) close to a linear expansion coefficient of a substrate under inspection or a substrate mounting portion of the inspection device, is preferred. Such linear expansion coefficient is preferably less than or equal to $1.5 \times 10^{-4}$/K and, further preferably in a range of $1 \times 10^{-7}$/K to $1 \times 10^{-4}$/K. As a particular example of the metal material of the positioning metal plate 16, iron, copper, nickel, chrome, cobalt, magnesium, manganese, molybdenum, indium, lead, palladium, titanium, tungsten, aluminum, gold, platinum, silver and the like, and alloys or alloy steels of two or more of these materials may be used.

When silicone is used as a substrate material of the substrate to be inspected, the material of the positioning metal plate 16 is preferred to have the linear expansion coefficient (1/K) less than or equal to $1.5 \times 10^{-5}$/K, and more preferably in a range of $1 \times 10^{-7}$/K to $1 \times 10^{-5}$/K. As such material, an invar type alloy, such as invar or the like, an elinvar type alloy, such as elinvar or the like, and a super invar, kovar, alloy 42 and so on may be used. By employing the metal material having small linear expansion coefficient, the conductive portions 12 and the insulation portion 8, under normal temperature, are not influenced by expansion of the positioning metal plate 16 due to temperature variation. Thus, stable electrical contact can be established.

On the other hand, the material of the positioning metal plate 16 to be used is only required to be etchable and thus is not particularly designated. Perforating of the positioning holes 10 and the through holes 16b on the positioning metal plate 16 can be performed by photolithography and etching. Therefore, the accuracy of perforating of the holes and freedom in designing the holes can be high. On the other hand, after the etching step, the surface of the positioning metal plate 16 is preferably covered with the insulation material, such as resin or the like.

A preferred thickness of the positioning metal plate 16 may be in a range of 0.01 to 10 times a thickness of the anisotropic conductivity sheet 11, further preferably in a range of 0.02 to 2 times, and particularly preferably in a range of 0.03 to 0.8 times.

In one example of the present invention, the positioning metal plate 16 is provided on the peripheral portion of the anisotropic conductivity sheet 11. As a manufacturing method of the positioning metal plate 16 and the anisotropic conductivity sheet 11, various methods may be used.

For example, a method of forming or curing the anisotropic conductivity sheet 11 under presence of the positioning metal plate 16, a method of engaging the positioning metal plate 16 and the anisotropic conductivity sheet 11, a method of cementing the positioning metal plate 16 and the anisotropic conductivity sheet 11 and so on may be used.

As one method of cementing the positioning metal plate 16 and the anisotropic conductivity sheet 11, a method of adhering the positioning metal plate 16 and the anisotropic conductivity sheet 11 with an adhesive can be used.

A joining portion between the positioning metal plate 16 and the anisotropic conductivity sheet 11 may be formed to place the positioning metal plate 16 on the upper surface or the lower surface of the anisotropic conductivity sheet 11. As shown in FIG. 2, the peripheral portion of the opening portion 16a of the positioning metal plate 16 can be buried in the anisotropic conductivity sheet 11, or, in the alternative, can be sandwiched between two anisotropic conductivity sheets 11. In such a case, the two anisotropic conductivity sheets 11 may be joined with each other through the through holes 16b formed in the peripheral edge portion of the opening portion 16a of the positioning metal plate 16. On the other hand, when the anisotropic conductivity sheet 11 is joined with the positioning metal plate 16 in an expanded condition, the anisotropic conductivity sheet 11 is hardly subject to variation, such as expansion due to temperature variation.

Figure 3:
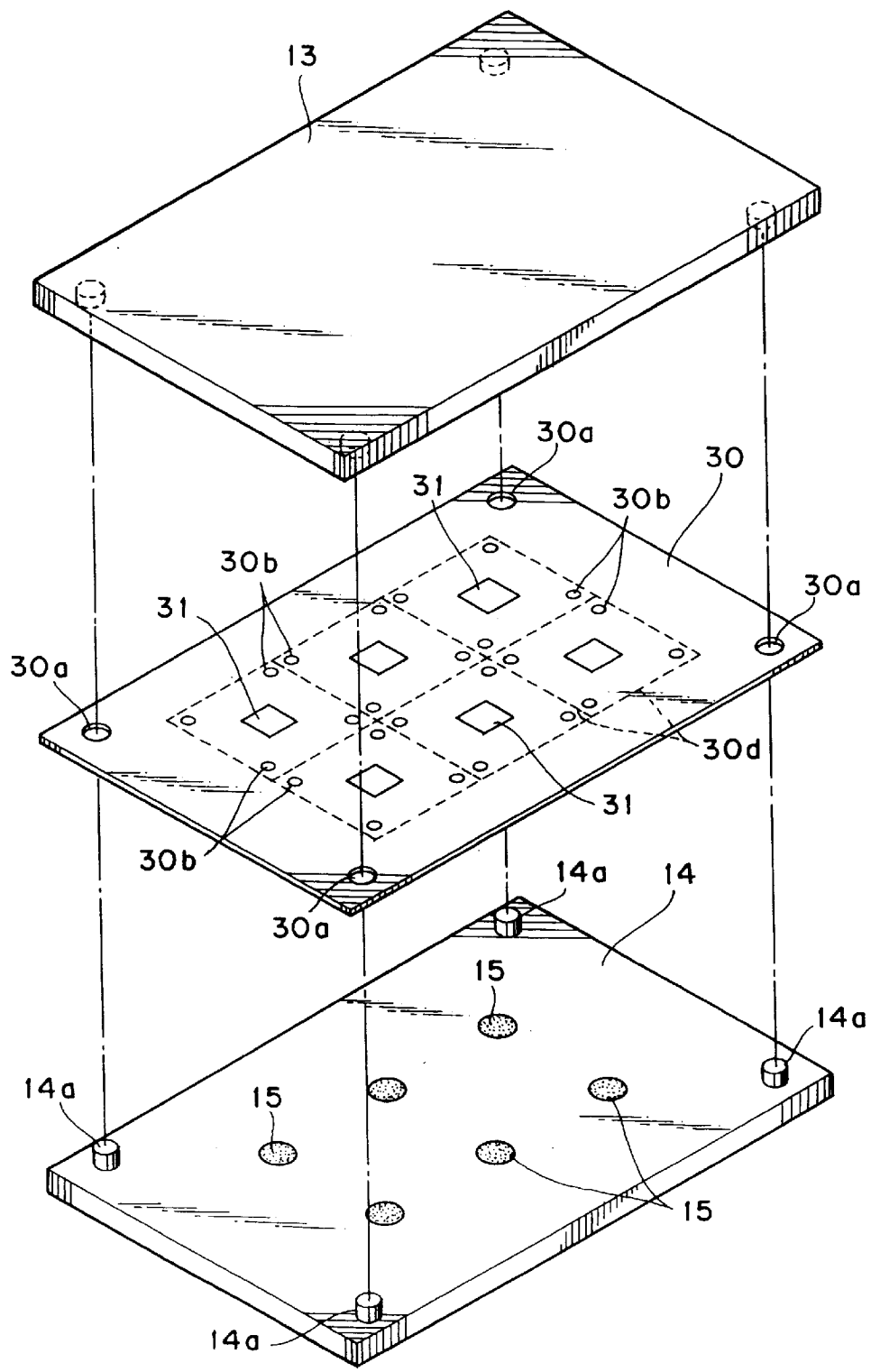
FIG. 3 is a perspective view for explanation of one embodiment of a manufacturing method of the anisotropic conductivity sheet according to the present invention.
Figure 4:
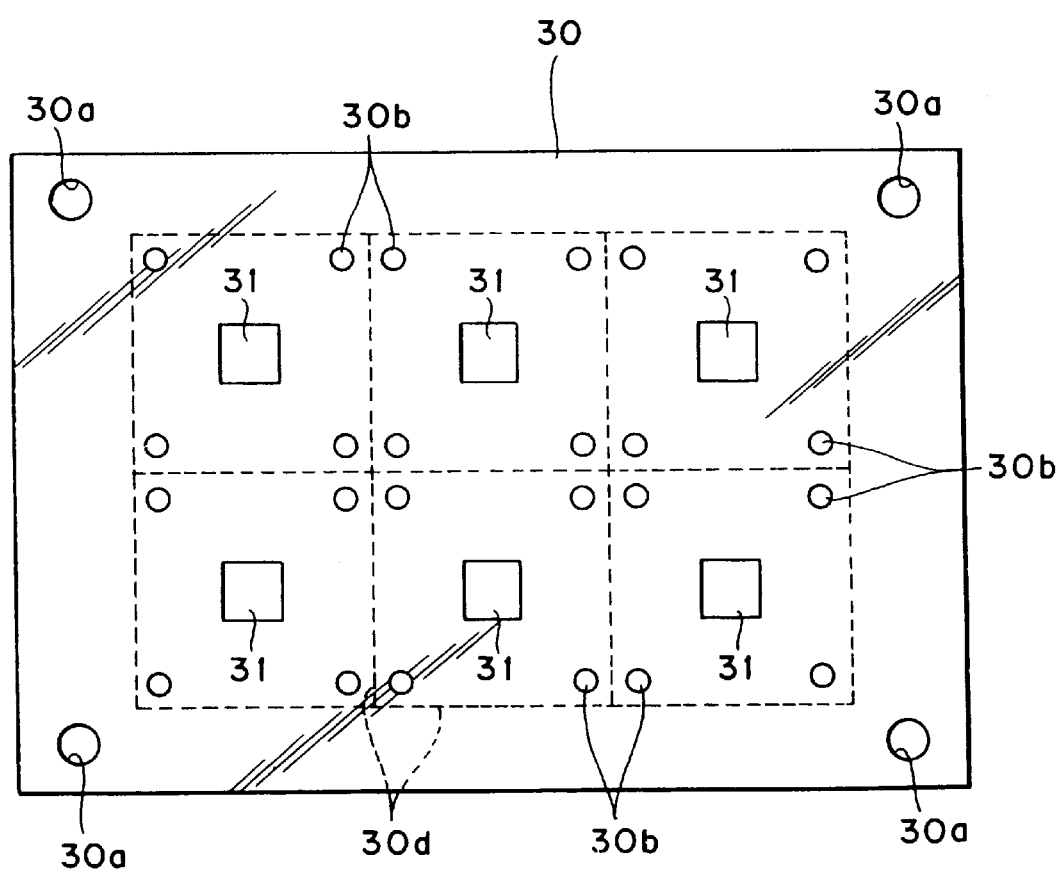
FIG. 4 is a plan view showing a positioning metal plate provided for explanation of one embodiment of a manufacturing method of the anisotropic conductivity sheet according to the present invention.

As shown in FIG. 3, when a plurality of anisotropic conductivity sheets 11, each having the positioning metal plate, are produced simultaneously by employing a pair of mutually opposing dies 13 and 14, at first, aggregated plate 30 of positioning metal plates is provided with perforation 30d at dividing portions, as shown in FIG. 4. The aggregated plate 30 may be a thin plate of stainless steel typically used as a material of a metal mask, for example.

The aggregated plate 30 has through hole openings 30a at positions corresponding to the positioning pins 14a respectively provided at four corners of the die 14, for example. On the other hand, the perforation 30d forms a contour of respective of the six positioning metal plates to be obtained, for example. At four corners inside of the perforation 30d forming the contour of respective positioning metal plates, through hole openings 30b corresponding to the positioning holes 10 of the obtained positioning metal plate 16 are provided. On the other hand, at substantially a center portion of the perforation 30d forming the contours of respective positioning metal plates, square through holes 31, corresponding to the opening portion 16a of the obtained positioning metal plate 16, are provided. On the peripheral edge portion of the through hole 31, a hole corresponding to the through hole 16b is provided (not shown). In machining of the aggregated plate 30, machining of perforation and perforating of the positioning holes, or perforating of the through hole opening 31 of the anisotropic conductivity sheet and so on can be done simultaneously with high precision and without increasing process steps, by employing photolithography, etching and so on.

The dies 13 and 14 are arranged for movement toward and away from each other. On the other hand, the dies 13 and 14 have a known construction respectively, having flat surfaces and can be transported.

Next, under presence of the aggregated plate 30, a conductive paste 15 is formed or cured on the die 14.

At this time, upon formation and curing of the conductive paste 15 on the die 14, the conductive paste 15 formed by coating gold on the surface of magnetic particles of nickel may be used as a conductive material. On the other hand, as a resin material of the paste, silicone rubber is used. By mixing the magnetic particles of nickel and the silicone rubber, the conductive paste can be formed.

Subsequently, a predetermined printing mask (not shown) is placed on the die, the conductive paste is printed respectively at positions corresponding to the through holes 31 of the aggregated plate 30 in the flat surface of the die by using squeezing as known in the art.

On one or both surfaces of the aggregated plate 30, between the dies 13 and 14, a spacer is disposed (not shown). The aggregated plate 30 is clamped between the dies 13 and 14, engaging the through holes 30a with the positioning pins 14a. It should be noted that the spacer is used for setting the position in the thickness direction relative to the aggregated plate 30 in the hardened conductive paste 15 at the proper position.

Figure 5:
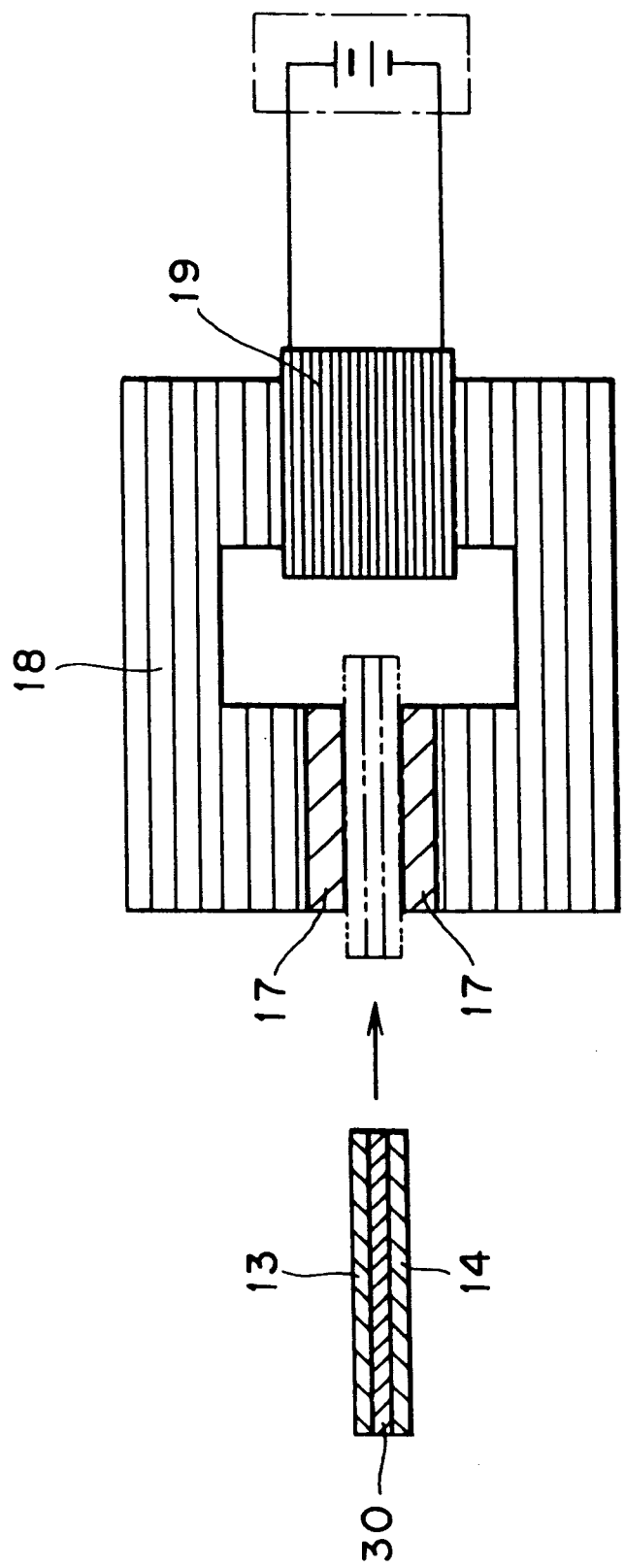
FIG. 5 is an illustration diagrammatically showing a magnetizing machine provided for explanation of one embodiment of a manufacturing method of the anisotropic conductivity sheet according to the present invention.

Subsequently, the dies 13 and 14 located at both sides across the aggregated plate 30 and the spacer are arranged at predetermined position of the magnetizing machine with a heater, as shown in FIG. 5.

The magnetizing machine with the heater is constructed with a U-shaped yoke 18, a magnetizing coil 19 coupled with the yoke 18 and a heater 17 respectively provided on a pair of magnetic poles of opposing end portions in the yoke 18. The magnetizing coil 18 and the heaters 17 are placed in an actuated condition by selectively supplying electric power from a control portion (not shown).

With the construction set forth above, as shown by two dotted lines in FIG. 5, the dies 13 and 14 located on both sides of the aggregated plate 30 and the spacer are clamped between the magnetic poles of the magnetizing machine having heaters. By heating and applying the magnetic field in the thickness direction of the aggregated plate 30 and the conductive paste 15, respective conductive pastes 15 are cured. Accordingly, since the resin is cured in the condition where the metal particles of the magnetic body of respective conductive pastes 15 are linked in the thickness direction of the aggregated plate 30, electrical conduction can be obtained when the predetermined pressure is applied to respective conductive pastes 15.

Accordingly, a plurality of conductive portions, via respective conductive pastes 15 and the aggregated plate 30, are formed on the same plane.

Then, after completion of formation, respective portions where respective conductive pastes 15 are formed are cut at the positions of the perforation 30d, and the anisotropic conductivity sheet 12 with the positioning portion 16 as shown in FIG. 1 is obtained.

It should be noted that while the aggregated plate 30 is employed in the foregoing embodiment, the present invention is not limited to the shown embodiment. When the number of the anisotropic conductivity sheets to be produced is relatively small, a die 33, on which each positioning metal plate 34 having four positioning holes 34a and the opening portion 34b, is individually arranged at a predetermined position.

Figure 6:
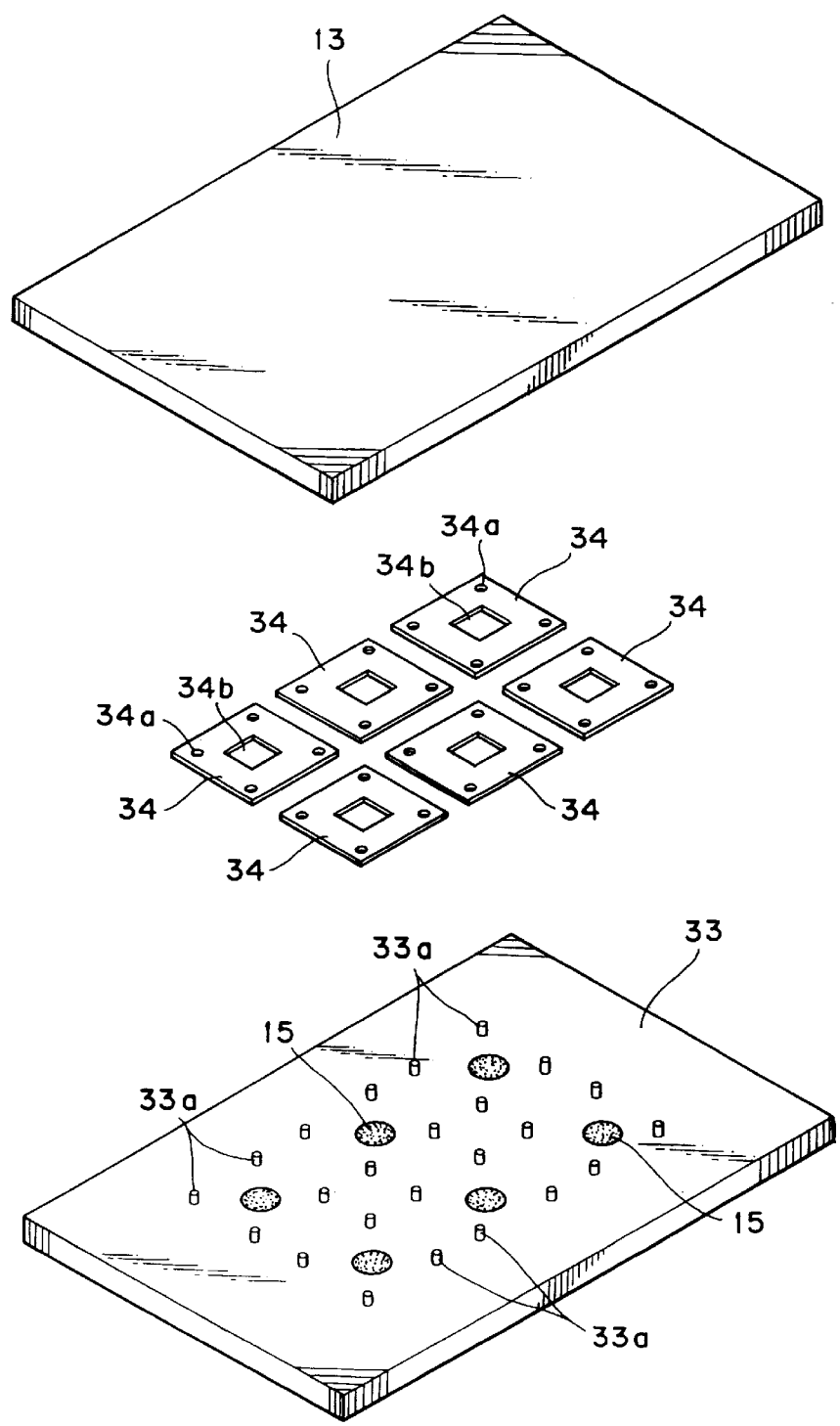
FIG. 6 is a perspective view for explanation of one embodiment of a manufacturing method of the anisotropic conductivity sheet according to the present invention.

In FIG. 6, the die 33 has positioning pins 33a extending from a flat surface for engaging with four positioning holes 34a of each positioning metal plate 34. The conductive paste 15 is formed substantially at a center of a portion surrounded by four positioning pins 33a as shown in FIG. 6.

Figure 7:
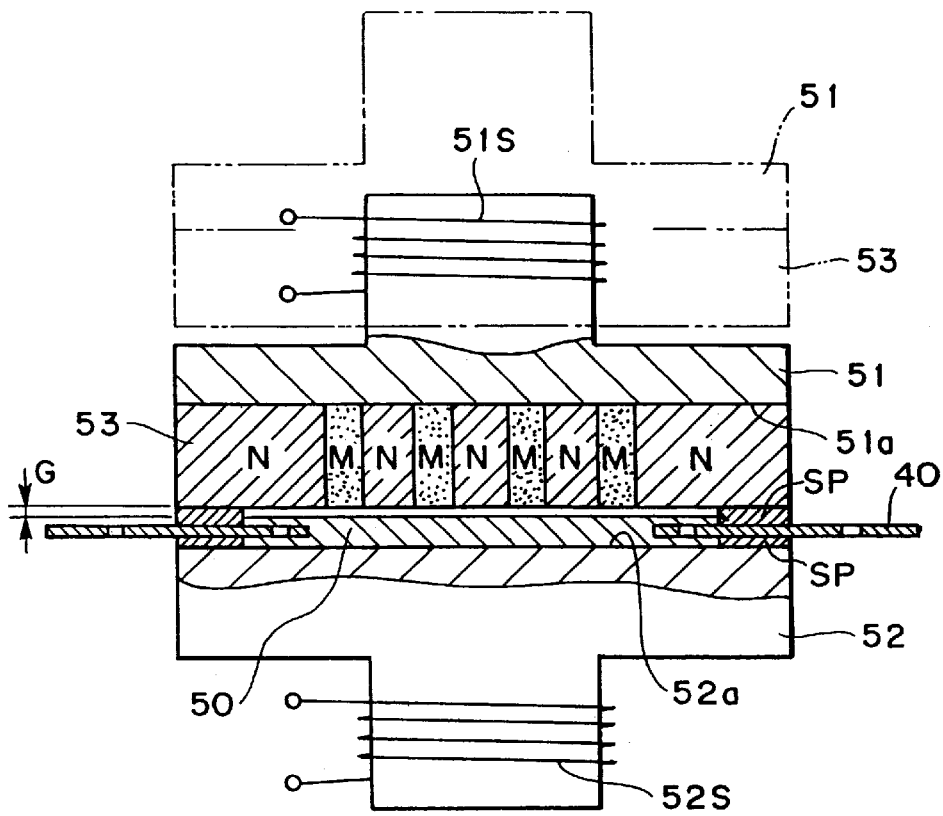
FIG. 7 is an illustration diagrammatically showing an apparatus used for a manufacturing method of the anisotropic conductivity sheet according to the present invention.
Figure 8:
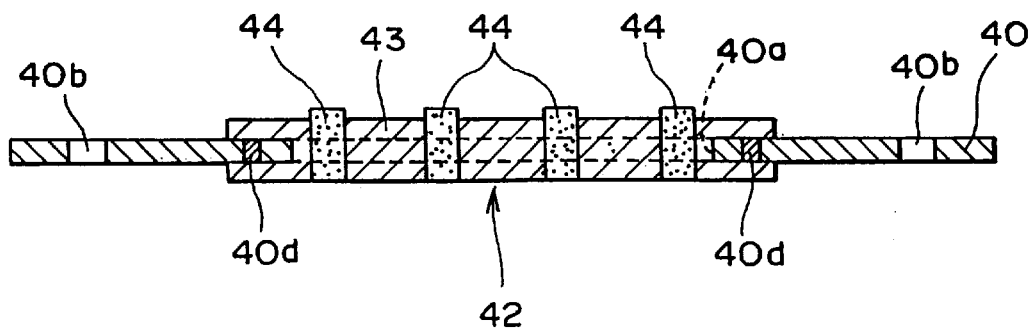
FIG. 8 is a section diagrammatically showing the anisotropic conductivity sheet with the positioning portion formed by the apparatus shown in FIG. 7.

FIG. 7 shows a general construction of an apparatus to be used for production of an anisotropic conductivity sheet 42 having a positioning metal plate 40 shown in FIG. 8.

In an example shown in FIG. 1, both ends of a thickness direction in the insulating portion 8 and respective conductive portions 12 are formed on the same plane with each other. In case of the anisotropic conductivity sheet 42 having the positioning metal plate 40 shown in FIG. 8, an upper face portion on one side of each conductive portion 44 extends a predetermined amount above an upper face portion of the insulating portion 43.

The frame for positioning the metal plate 40 is formed into substantially a square shaped configuration using stainless steel as in the foregoing embodiment. At the center portion, the positioning metal plate 40 is formed with a square opening portion 40a, in which the insulating portion 43 and a plurality of conductive portions 44 are formed. On the other hand, the positioning metal plate 40 has positioning holes 40b with a predetermined interval at respective corners thereof.

A lower face portion on the side of each conductive portion 44 are on the same plane as the lower face portion of the insulating portion 43, as shown in FIG. 8.

The anisotropic conductivity sheet 42 having the foregoing positioning metal plate 40 is used in the apparatus shown in FIG. 7 and produced in the following manner, for example.

The apparatus shown in FIG. 7 is constructed with an upper die 51 having an electromagnetic coil 51S, a lower die 52 being arranged in opposition to the upper die 51 and having an electromagnetic coil 52S, and a magnetic pole plate 53 fixed on a flat surface opposing the upper die 51 and the lower die 52, as primary components.

To the electromagnetic coils 51S and 52S, power is selectively supplied from a power supply control portion (not shown).

The magnetic pole plate 53 is constituted of a ferromagnetic portions M (shown by hatching) and having a pattern corresponding to a connecting electrode of a substrate to be measured or an electrical circuit board for connection. A non-magnetic portion N is formed between the ferromagnetic portions M at either sides thereof. A surface opposing to the lower die 52 of the magnetic pole plate 53 is a flat surface.

On the surface of the lower die 52 opposing the upper die 51, an elastomer material 50 which will be explained later, is filled in a predetermined amount and defines a cavity 52a, in which the positioning metal plate 40 is arranged.

Upon production of the anisotropic conductivity sheet 42 having the positioning metal plate 40, as an example of the method used, the elastomer material 50 is prepared by forming a fluid mixture, in which a conductive magnetic material, such as nickel particle and the like, is dispersed in a silicone rubber, for example. Next, as shown by dotted lines in FIG. 7, the upper die 51 is elevated, and the elastomer material 50 is filled within the cavity 52a of the lower die 52, in which one positioning metal plate 40 is sandwiched therebetween and two spacers SP are arranged.

Subsequently, as shown by solid lines in FIG. 7, the upper die 51 is lowered so that the flat lower surface of the magnetic pole plate 53 contacts the elastomer material 50 until a predetermined gap G is formed.

Subsequently, at this condition, the electromagnetic coils 51S and 52S of the upper die 51 and the lower die 52 are placed in an actuated condition to apply a magnetic field parallel to the thickness direction of the elastomer material 50. As a result, in the ferromagnetic portion M in the elastomer material 50, the parallel magnetic field stronger than that in other portion (non-magnetic portion N) is applied in the thickness direction. By application of the parallel magnetic field having distribution as set forth above, the conductive magnetic particles in the elastomer material 50 are concentrated such that the magnetic force applied by the ferromagnetic portion M is oriented in the thickness direction thereof.

At this time, on the surface side of the electromagnetic coils 51S and 52S of the upper die 51 and the lower die 52, if a gap G is present, a material of a high molecular compound is similarly moved by concentric motion of the conductive magnetic material. As a result, the surface of the material of a high molecular compound bulges at portions corresponding to the ferromagnetic portion M to form the projecting conductive portions 44 as shown in FIG. 8.

Then, while maintaining the action of the parallel magnetic field via the electromagnetic coils 51S and 52S of the upper die 51 and the lower die 52, or after removal of the parallel magnetic field, a hardening or curing process, such as heating or the like is performed for the elastomer material. Thus, the anisotropic conductivity sheet 42 having the projecting conductive portions 44 and the insulating portion 43, and the positioning metal plate 40, is produced.

Figure 9:
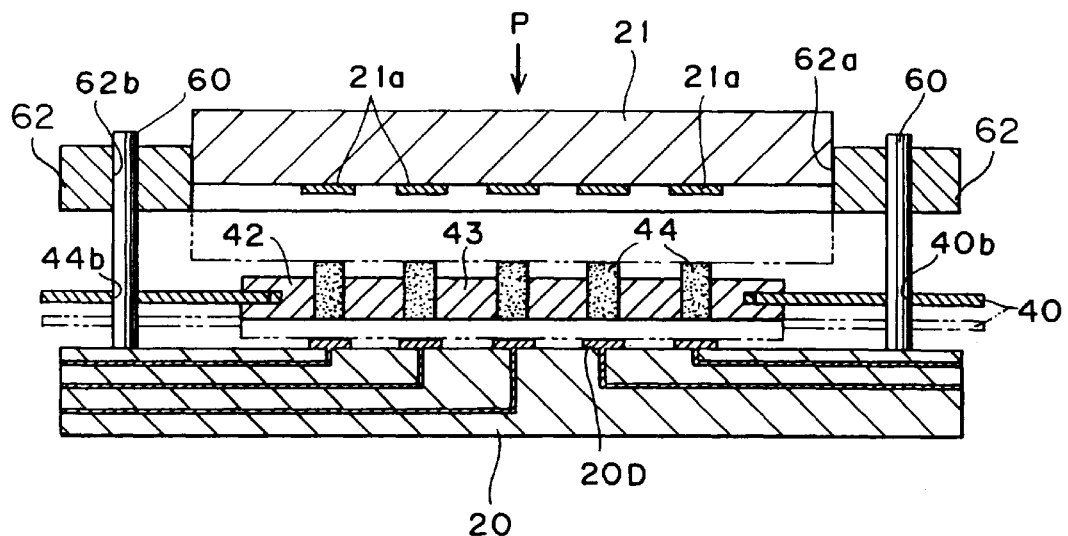
FIG. 9 is a conceptual illustration showing a construction of a socket for electrical inspection, to which one embodiment of the anisotropic conductivity sheet with the positioning portion according to the present invention is applied.

Next, one embodiment of an apparatus using the anisotropic conductivity sheet with the positioning metal plate according to the present invention will be explained. In FIG. 9, like components as those of the anisotropic conductivity sheet 42 with the positioning metal plate 40 shown in FIG. 8, will be identified by like reference numerals to avoid redundant description for keeping the disclosure simple enough to facilitate clear understanding of the present invention.

In FIG. 9, such an apparatus is a testing apparatus of an inspection object 21, such as a semiconductor element.

The apparatus is constructed with a measuring substrate 20 to be used for inspection and measurement of the inspection object 21, such as the electrical circuit component, electrical circuit board or the like. The apparatus includes four supporting shafts 60 respectively provided corresponding to the positioning holes 40b of the positioning metal plate 40 at a regular interval on the measuring substrate 20, and a positioning member 62 for positioning the inspection object 21 relative to the anisotropic conductivity sheet 42.

The inspection object 21 has a plurality of electrodes 21i aformed with a given interval on a surface opposing to the anisotropic conductivity sheet 42 mounted on the measuring substrate 20.

The positioning member 62 has an opening portion 62a, in which the outer peripheral portion of the inspection object 21 is disposed. On the circumference of the positioning member 62, a plurality of holes 62b are provided for engaging with the supporting shafts 60. Between the measuring substrate 20 and the inspection object 21, positioning of both of the electrode group 20D of the measuring substrate 20 of the conductive portion 44 in the anisotropic conductivity sheet 42 and the electrode 21a of the inspection object 21 is performed using the positioning holes 40b.

The measuring substrate 20 has an electrode group 20D contacting respective conductive portions on the side of the surfaces opposing the anisotropic conductivity sheet 42. The electrode group 20D is electrically connected to a testing operation control portion (not shown) supplying a predetermined testing current through a predetermined conductive layer.

With such a construction, upon testing, the inspection object 21 arranged in the opening portion 62a and is pressed with a predetermined pressure P, as shown by the two dotted lines in FIG. 9.

Accordingly, between the electrode group 20D of the measuring substrate 20 and the electrode 21a of the inspection object 21, electrical conduction through the conducting portion 44 of the anisotropic conductivity sheet 42 can be obtained to enable inspection and measurement of the inspection object by the testing operation control portion.

Figure 11:
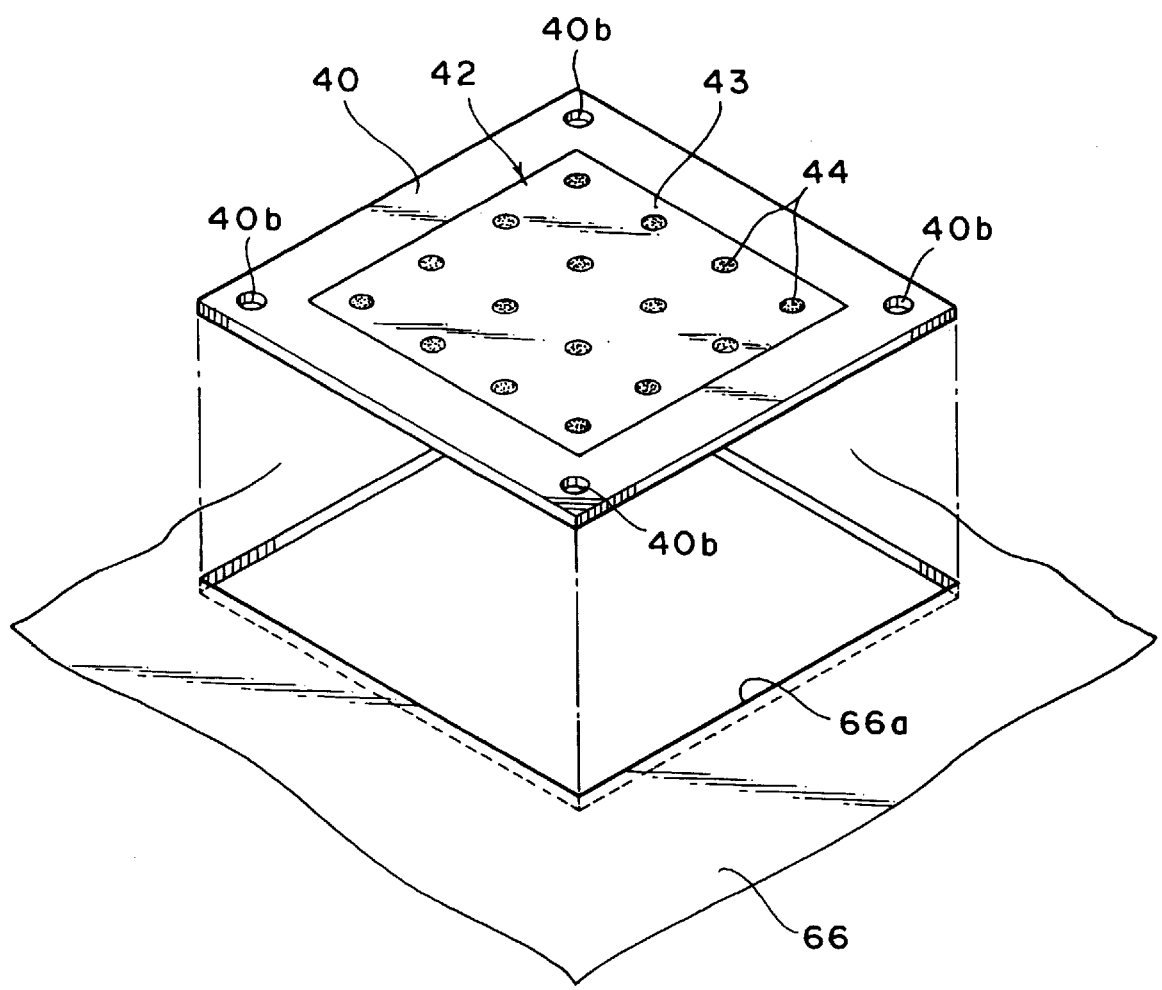
FIG. 11 is a perspective view for explaining one embodiment of an application method of the anisotropic conductivity sheet with the positioning portion according to the present invention.

On the other hand, a method for performing positioning of the electrode group 20D and the electrodes 21a, without using the foregoing positioning hole 40b, is shown in FIG. 11. In this case, positioning is performed by utilizing the outer peripheral end portion of the positioning metal plate 40.

Namely, at positions corresponding to the electrode group 20D of the measuring substrate 20, a positioning member 66 having an opening portion 66a, in which the positioning metal plate 40 is engaged, is mounted on the electrode group 20D on the measuring substrate 20. In this way, positioning of the opening portion 66a of the positioning member 66 relative to the opening portion 62a of the positioning member 62 and the opening portion 66a of the positioning member 66 relative to the electrode group 20D of the measuring substrate 20 is performed. Accordingly, positioning of the conductive portion 44 in the anisotropic conductivity sheet 42 relative to both of the electrode group 20D of the measuring substrate 20 and the electrodes 21a of the inspection object 21 is achieved.

On the apparatus shown in FIG. 9, repeated testing was performed by the inventors by varying the temperature of the inspection object 21 from room temperature to about 120° C. As a result, it has been confirmed that a position error of the conductive portion 44 of the anisotropic conductivity sheet 42 or a conduction failure of the conductive portion 44 will be prevented, enabling stable inspection and measurement over a long period of time.

Figure 10:
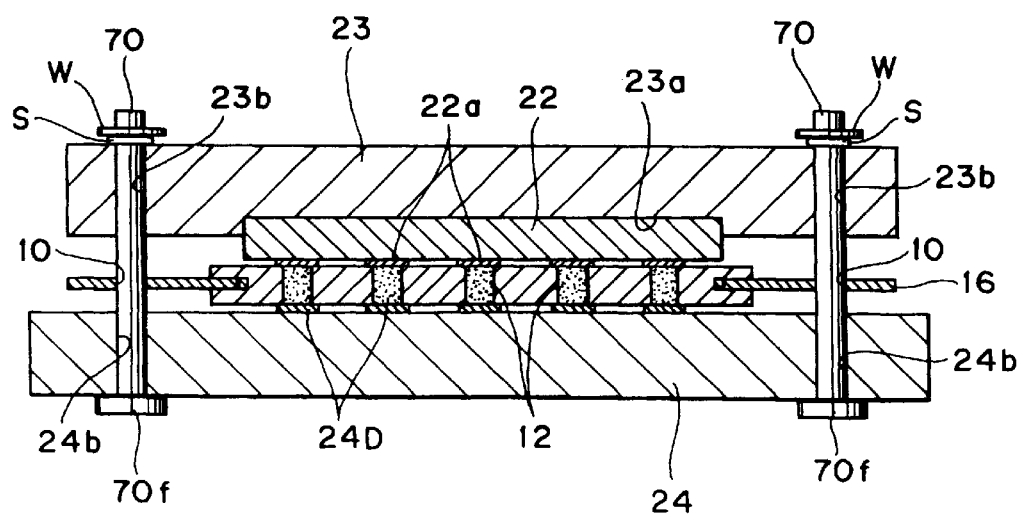
FIG. 10 is a conceptual illustration showing a construction of a connector for electrical connection, to which one embodiment of the anisotropic conductivity sheet with the positioning portion according to the present invention is applied.

FIG. 10 shows another embodiment of the apparatus, to which one embodiment of the anisotropic conductivity sheet with the positioning portion according to the present invention, is installed. It should be noted that, in FIG. 10, like components to those the anisotropic conductivity sheet 11 having the positioning metal plate 16 shown in FIG. 1 will be identified by like reference numerals to avoid redundant description for keeping the disclosure simple enough to facilitate clear understanding of the present invention.

The apparatus shown in FIG. 10 is used for mutual electrical connection between the electrodes 22a of the electric circuit component 22 and the electrode group 24D of the electric circuit board 24.

The shown apparatus 9 is constructed with a pressurizing fastening jig 23 having a recessed portion 23a, in which the electrical circuit component 22 is housed on the surface side opposing to the electrical circuit board 23. The apparatus includes a plurality of supporting shafts 70 respectively extending through a plurality of through holes 24b of the electrical circuit board 24, positioning holes 10 of the positioning metal plate 16 and a plurality of through holes 23b of the pressurizing fastening jig 23, and a spring member S biasing the electrical circuit component 22 and the pressurizing fastening jig 23.

The supporting shaft 70 has a flange portion 70f engaging with the electrical circuit board 23 on a bottom end portion thereof and has a washer W fixing the end of the spring member S on the other end thereof.

The spring member S is wound around the supporting shaft 70 at a position between the washer W and the pressurizing fastening jig 23.

Accordingly, upon use for electrical connection between the electrical circuit component 22 and the electrical circuit board 24, positioning of the conductive portion 12 in the anisotropic conductivity sheet 11 relative to the electrodes 22a of the electrical circuit component 22 and positioning of the conductive portion 12 of the anisotropic conductivity sheet 11 relative to the electrode group 24D of the electric circuit board 24 can be performed using the positioning hole 10 of the positioning metal plate 16.

By sandwiching the anisotropic conductivity sheet 11 between the electrical circuit component 22 and the electric circuit board 24 and by biasing by means of the spring member S to depress the anisotropic conductivity sheet 11 together with the pressurizing fastening jig 23, electrical connection can be established. Also, under a condition enabling semi-permanently pressurizing and fastening the electrical circuit component 22 on the electrical circuit board 24, the electrical circuit board 24 can be operated.

The present invention has been described in detail with respect to various embodiments, and it will now be apparent from the foregoing to those skilled in the art that changes and modifications may be made without departing from the invention in its broader aspects, and it is the intention, therefore, in the appended claims to cover all such changes and modifications as fall within the true spirit of the invention.

What is claimed is:

1. An anisotropic conductivity sheet, comprising:
   an insulator formed of an elastic material;
   at least one conductive portion provided on said insulator, and including conductive material formed in said elastic insulator in a thickness direction thereof; and
   a metal plate having an opening provided therein;
     wherein said anisotropic conductivity sheet is positioned in said opening provided in said metal plate, and
     a peripheral edge portion of said opening in said metal plate is provided for relative positioning of said at least one conductive portion and is securely fixed to an edge portion of said insulator of said anisotropic conductivity sheet.

2. The anisotropic conductivity sheet of claim 1, wherein a linear expansion coefficient of said metal plate is less than or equal to $1 \times 10^{-5}/K$.

3. The anisotropic conductivity sheet of claim 1, wherein said metal plate is provided with at least one hole for performing positioning of said anisotropic conductivity sheet with respect to devices to be tested.

4. The anisotropic conductivity sheet of claim 1, wherein an outer peripheral portion of said metal plate is arranged between one or more external positioning members.

5. The anisotropic conductivity sheet of claim 1, wherein said insulator of said anisotropic conductivity sheet includes through holes extending through said insulator on a periphery thereof.

6. The anisotropic conductivity sheet of claim 1, wherein a plurality of said conductive portions are formed with top surfaces of said conductive portions and a top surface of said insulator on substantially a same plane.

7. The anisotropic conductivity sheet of claim 1, wherein a plurality of said conductive portions are formed with top surfaces of said conductive portions projecting higher than a top surface of said insulator.

8. The anisotropic conductivity sheet of claim 1, wherein said metal plate is obtained by dividing one piece of an aggregated plate, in which a plurality of metal plates are aggregated.

9. The anisotropic conductivity sheet of claim 1, wherein an aspect ratio of the conductive material is in a range of 1 to 1000.

10. The anisotropic conductivity sheet of claim 1, wherein an aspect ratio of the conductive material is in a range of 1 to 100.

11. The anisotropic conductivity sheet of claim 1, wherein the conductive material includes a magnetic material.

* * * * *